LIMITER CIRCUIT

Filed May 11, 1966

INVENTOR.
LAWRENCE R. LAVALLEE

BY David M Keay

AGENT.

3,465,170
Patented Sept. 2, 1969

3,465,170

LIMITER CIRCUIT

Lawrence R. Lavallee, Stow, Mass., assignor to Sylvania Electric Products Inc., a corporation of Delaware Filed May 11, 1966, Ser. No. 549,286
Int. Cl. H03k 5/08
U.S. Cl. 307—237 8 Claims

ABSTRACT OF THE DISCLOSURE

Limiter circuit including a complementary pair of transistors arranged to provide an amplifier and a limiting network having one terminal connected to the collector of one transistor and the base of the other transistor and a second terminal connected to the emitter of the one transistor and the collector of the other transistor. The limiting network includes a capacitor having one end connected to the one terminal and a pair of oppositely poled diodes connected in parallel between the other end of the capacitor and the second terminal.

This invention relates generally to electronic circuits and more particularly to an improved limiter circuit.

Limiter circuits, which produce a constant output signal from a varying input signal, have many applications in electronic systems. For example, in radar receiver systems, limiters are used to provide a reference signal to the detector circuit which converts the received modulated signal into a video signal to operate the video portion of the receiver system. It is well known that coherent detectors provide superior performance due to their ability to use both the phase and the amplitude information present in the received signal. They, therefore, have the ability to detect information having a low signal to noise ratio. In the past, however, coherent detectors have had very limited use due to the lack of a limiter circuit which could provide a constant amplitude reference signal to the detector over a wide frequency range and a wide dynamic range of input signal amplitude with a small change of phase.

Another application of limiters is in magnetic tape FM systems, where dropouts, tape tracking errors and spacing losses contribute to wide fluctuations in signal level. More important, in wideband FM systems, the center frequency lies well beyond the peak output point of the reproduce-head wave, so that the limiter is presented with an input dynamic range of nearly 40 db and a direct correlation between frequency and level.

Typical prior art limiters use several techniques in an attempt to solve these problems. Shunt diodes are inserted into tuned circuits and work well as long as the input signal level remains either above or below the threshold conduction level of the diodes. However, when the circuit goes from nonlimiting to full limiting, as is required by a wide dynamic range, the change of phase becomes very large resulting in changes as large as ±30 degrees. Limiting by use of transistors in saturation produces large changes of phase due to the storage effect of the transistors. Limiting by use of collector current cutoff in a transistor produces a wide dynamic range capability, but it has the disadvantages of narrow bandwidth, the center frequency being restricted to frequencies below 10 to 15 megahertz and amplitude limiting to only 3.5 db. Current mode limiters have the necessary wide dynamic range, but, however, are again frequency limited to below about 20 megahertz. It is difficult to obtain a wide, flat bandwidth in excess of 5 megahertz with any of the above circuits. This, of course, restricts their use to systems employing relatively long, greater than 0.5 microsecond, pulse widths. In addition, changes in operating characteristics as the above circuits go from amplification to limiting cause serious problems in matching input and output impedances. These changes also quite often result in shifts in the passband shape and center frequency.

Accordingly, it is an object of the present invention to provide an improved limiter circuit.

Another object of the invention is to provide a limiter circuit that will provide a constant amplitude output signal with a minimum change of phase as the input signal is varied through its dynamic range.

Still another object of the invention is to provide a limiter circuit capable of limiting signals over a wide center frequency range with a wide flat bandwidth.

A further object of the invention is to provide a limiter circuit which can be produced inexpensively due to a modular design in which the major parameters of limiting range, input impedance, output impedance, center frequency and bandwidth are set independently.

Briefly, the invention in its broadest aspect comprises a limiting network, a high impedance input circuit, and a high impedance output circuit. The high impedance of the input and output circuits is provided by a pair of complementary transistors. The first transistor is located at the output of the input circuit and the limiter network is connected between the collector and the emitter. The second transistor is located at the input to the output circuit and base and collector are connected to the emitter and the collector, respectively, of the first transistor. The transistors serve to isolate the limiting network from the tuned portions of the input and output circuits, thus minimizing changes in phase and in input and output impedances as the limiting network goes from nonlimiting to full limiting. In addition, the transistors provide wideband, high gain amplification. The input circuit has an input terminal and the output circuit has an output terminal. A limiter constructed in accordance with the invention is capable of limiting input signals varying over a wide dynamic range and of restricting changes in phase to allowable levels over the same dynamic range with no shift in center frequency or bandwidth.

The foregoing, together with other objects, features and advantages of the invention will be better understood from the following detailed description, taken in conjunction with the drawings in which.

Figure 1:
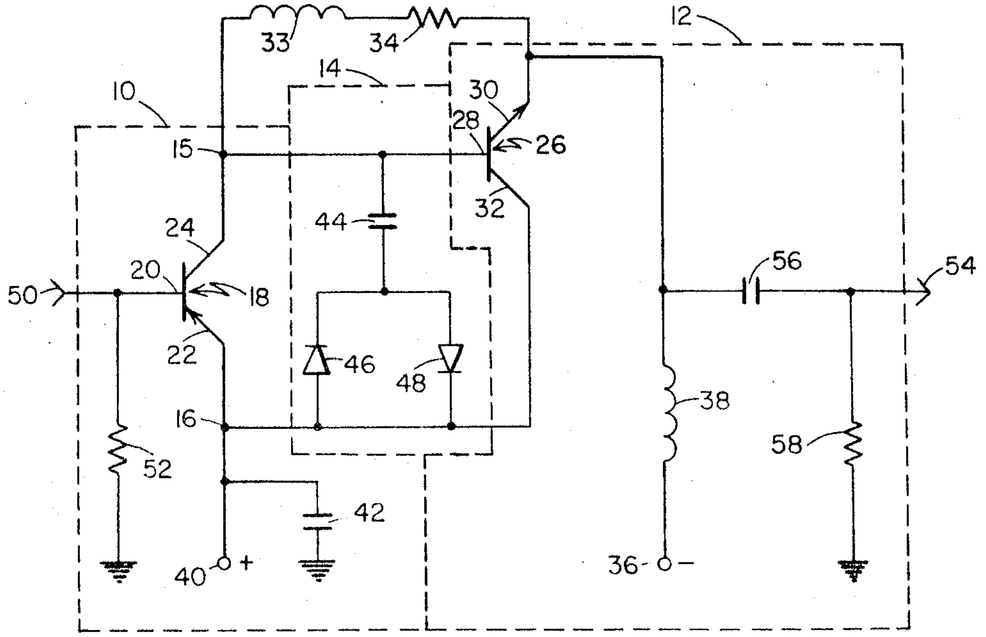
FIG. 1 is a schematic diagram of a limiter according to the invention.

Referring to FIG. 1, there is shown a first embodiment of a limiter circuit including an input circuit 10, an output circuit 12, and a limiter network 14. The limiter network 14 is connected between the two output terminals 15 and 16 of the input circuit 10 which are also the input terminals to the output circuit 12. The input circuit 10 and the output circuit 12 provide high input and output impedance to the limiter network 14 to isolate any changes in impedance level as the limiter network changes from non-limiting to limiting. These impedance changes, which if allowed to affect the performance of other circuitry would result in significant changes in phase of the signal, are, therefore, avoided.

In detail there is shown a complementary transistor pair consisting of a PNP transistor 18 and an NPN transistor 26. The collector 24 and the emitter 22 of transistor 18 are directly connected respectively to the base 28 and the collector 32 of transistor 26. A series network consisting of an inductor 33 and a resistor 34 is connected between the collector 24 and the emitter 30 of transistor 26. A source of suitable negative operating potential 36 is connected to the emitter 30, via an inductor 38 which provides high frequency isolation of the radio frequency signals from the operating potential. A source of suitable positive operating potential 40 is connected to the emitter 22 with a capacitor 42 connected between the emitter 22 and ground to bypass RF energy to ground in the conventional manner.

The limiter network 14 comprises an alternating current coupling capacitor 44 connected between the base 28 and the cathode of diode 48, the anode of which is connected directly to the emitter 22. A second diode 46 is directly connected in parallel with diode 48. The anode and cathode of diode 46 being connected to the cathode and the anode, respectively, of diode 48.

In operation, an input radio frequency signal is applied to the base 20 of transistor 18 through the input terminal 50 which has an input impedance matching resistor 52 connected between it and ground. An output signal is obtained at the output terminal 54 which is connected via a DC blocking capacitor 56 to the emitter 30. An output impedance matching resistor 58 is connected between the output terminal 54 and ground.

The pair of parallel connected, oppositely polarized, shunt diodes 46 and 48 form a parallel diode clipper circuit. If the incoming signal level, as represented by the collector to emitter voltage of transistor 18, is above the threshold conduction level of the diodes, then one of the diodes is forward biased and conducts, while the other diode is reverse biased and acts as an open circuit. This limits the value of the output signal to the threshold conduction level of the conducting diode. If the polarity of the input signal is reversed, the former diode becomes reverse biased, and the latter diode conducts and limits the level of the output signal to the value of the threshold conduction level. If the input signal level is below the threshold conduction level of the diodes, both diodes present a high impedance; and the circuit acts as a high gain amplifier.

The two transistors 18 and 26 provide high input and output impedances to the limiter network, thereby isolating the impedance changes created by the diodes as they go into limiting. The tuned portions of the input and output circuits, therefore, see an essentially constant impedance and do not become detuned. It is this detuning of the circuit which caused the severe phase shift in previous limiters. In addition, isolation of the diodes permits the use of the fixed value resistors 52 and 58 to set the input and output matching impedances, thereby avoiding the problem of fluctuations in input and output impedance previously caused by variations in the level of the input signal.

High gain is provided by the two transistor combination due to the reduction of the emitter degeneration of transistor 18 to essentially zero. High frequency operation of the limiter circuit is provided by the high frequency compensating action of the inductor 33, by use of transistors displaying high frequency and low capacity characteristics and by careful circuit layout which is made possible by the complementary nature of the transistors. Additionally, transistor 18 should have a high DC dissipation characteristic, as will be explained hereinafter.

The diodes should display high speed and high conductance characteristics. Resistor 34 acts as a shunt to the composite transistor, thereby maintaining the low frequency gain at essentially the same gain as a single transistor. Inductor 33 provides frequency compensation by increasing the impedance of the series network at higher frequencies, thus maintaining the gain over an extended range, as is well known. The high conductance of the diodes coupled with their short storage time and the wide bandwidth of the amplifier result in excellent amplitude limiting for even narrow pulse widths.

It will be appreciated that the circuit can also be constructed with the transistor in reverse order to that shown in FIG. 1. This is, transistor 18 can be NPN type while transistor 26 can be of the PNP type, with the corresponding changes in the polarity of the operating potentials. It is desirable to keep the interconnections between the components and particularly the transistors as short as possible to prevent oscillation of the circuit at high frequencies. Awkward bias arrangements, which would be necessary if noncomplementary transistors were used, are eliminated, thus permitting the relatively simple circuit of FIG. 1.

Figure 2:
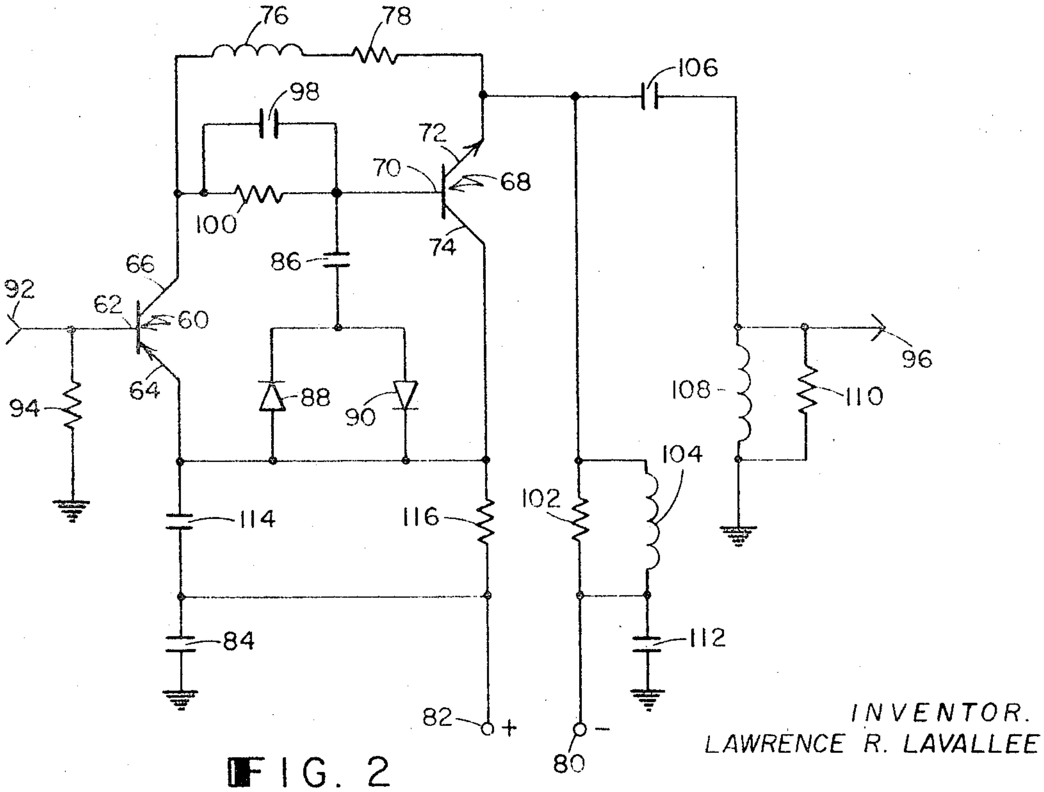
FIG. 2 is a schematic diagram of another embodiment of a limiter constructed in accordance with the invention.

Another embodiment of the invention is shown in FIG. 2. This corcuit is similar to that shown in FIG. 1. However, it allows for the use of a transistor in the input circuit which has a lower dc dissipation characteristic. The circuit contains transistors 60 and 68, diodes 88 and 90, resistors 94 and 78, sources of operating potential 80 and 82, capacitor 84, inductor 76, input terminal 92, and output terminal 96 which are connected and perform in similar manner to the circuit illustrated in FIG. 1. A simple R–C high-pass filter comprising a capacitor 98 and a resistor 100 is connected between the collector 66 of transistor 60 and the base 70 of transistor 68. A constant *k* high-pass output filter is comprised of a resistor 102 and an inductor 104 connected in parallel between the source of negative operating potential 80 and the emitter 72 of transistor 68, a capacitor 106 connected between the emitter 72 and the output terminal 96, and a resistor 110 and an inductor 108 connected in parallel between the output terminal 96 and ground. A capacitor 112 is connected between the source of negative operating potential and ground to by-pass radio frequency energy in the conventional manner. A capacitor 114 and a resistor 116 are connected in parallel between the emitter 64 of transistor 60 and the source of positive operating potential 82 to insure against circuit oscillation.

The lower current handling capability of transistor 60 allows the input signal to be partially detected and integrated by transistor 60. The resulting low frequency video pulse thus created is then amplified in the limiter, and without the addition of the blocking filters to attenuate this pulse, it would eventually reach a level sufficient to cut off the bias on a following transistor stage. The manner of creation of this pulse is, at present, not fully understood, but the R–C, 98 and 100, and the constant *k* high-pass filters, 102, 104, 106, 108, and 110, do eliminate its effect on the operation of the circuit. Resistor 116 and capacitor 114 serve to prevent circuit oscillation at high frequencies by overcoming the difficulties caused by inefficiencies in the mechanical layout of the circuit.

A three-stage limiter circuit embodying the present invention as shown in FIG. 2 was constructed and successfully operated. The components at each stage had the following values.

| | | |
|---|---|---|
| Resistor **78** | ohms | 39 |
| Resistor **94** | do | 75 |
| Resistors **102** and **110** | do | 150 |
| Resistor **100** | kilohms | 1.5 |
| Resistor **116** | ohms | 2.7 |
| Capacitors **84** and **112** | microfarad | 0.1 |
| Capacitor **86** | do | 0.001 |
| Capacitor **106** | picofarads | 36 |

| | | |
|---|---|---|
| Capacitor **98** | do | 110 |
| Capacitor **114** | do | 51 |
| Inductor **76** | microhenries | 82 |
| Inductors **104** and **108** | do | 1.5 |
| Transistor **60** | | 2N1141 |
| Transistor **68** | | 2N3137 |
| Diodes **88** and **90** | | 1D6050T |

The operating potentials 80 and 82 were approximately −9 volts and +0.5 volt, respectively. These particular bias voltages produced a current of approximately 34.5 milliamperes through transistor 60 and of approximately 29.5 milliamperes through transistor 68.

The three limiter stages were cancaded to limit an input signal with a 40 db dynamic range. Each of the limiter stages was capable of 15 db of wideband gain. Following the limiter stages, an output filter was employed to set the center frequency at 30 megahertz and to supply a bandwidth of 10 megahertz. The bandwidth, as measured, was flat to within ±0.1 db. The circuit amplitude limited to within ±0.1 db with a maximum phase shift of ±3 degrees, the passband shape and center frequency remained unchanged, and the circuit limited effectively on pulse widths as short as 0.2 microsecond duration.

The above characteristics show that the phase does not change appreciably as the limiter stage goes from nonlimiting to full limiting. The input and output impedances are determined by resistors which are fixed in value, and the passband and center frequency are wholly determined by the filter used. Therefore, the circuit could be divided into a series of standard modules, such that custom limiters for various bandwidths, frequencies, input and output impedances, and limiting range could be quickly and economically designed and constructed.

While there have been described what are now thought to be preferred embodiments of the present invention, many modifications and changes will occur to those skilled in the art without departing from the true spirit and scope thereof. For example, any of other various bias arrangements which apply the correct currents and voltages to the transistors can be employed. Also, filtering can be accomplished by any of several well-known means. Accordingly, it is not intended to limit the scope of the invention by what has been particularly shown and described except as defined in the appended claims.

What is claimed is:

1. A limiter circuit comprising
first and second transistors each having an emitter, a collector, and a base, the second transistor being complementary to the first transistor,
means connecting the collector of the first transistor to the base of the second transistor,
means connecting the emitter of the first transistor to the collector of the second transistor,
circuit means connected between the emitter of the second transistor and the collector of the first transistor,
a limiting network connected between the base of the second transistor and the emitter of the first transistor,
a first source of reference potential connected to the emitter of the first transistor,
a second source of reference potential connected to the emitter of the second transistor,
input connec'ion means for coupling an input signal to the base of the first transistor, and
output connection means for deriving an output signal from the emitter of the second transistor.

2. A limiter circuit according to claim 1 in which said limiting network comprises first and second diodes, the anode and the cathode of said first diode being connected to the cathode and the anode, respectively, of said second diode.

3. A limiter circuit according to claim 1 in which
said circuit means connected between the emitter of the second transistor and the collector of the first transistor comprises a high frequency compensation network, and
said limiting network comprises
first and second diodes, the anode of the first diode and the cathode of the second diode being connected to the emitter of the first transistor, and the cathode of the first diode being connected to the anode of the second diode, and
alternating current coupling means having one terminal connected to the cathode of the first diode and the anode of the second diode and having another terminal connection to the base of the second transistor.

4. A limiter circuit according to claim 3 in which
the anode of the first diode and the cathode of the second diode are connected directly to the emitter of the first transistor and to the collector of the second transistor, and
the alternating current coupling means comprises a capacitor having one terminal connected directly to the cathode of the first diode and the anode of the second diode and having the other terminal connected directly to the base of the second transistor.

5. A limiter circuit according to claim 4 in which
said input connection means comprises
an input terminal,
means for connecting said input terminal to the base of the first transistor, and
a resistor connected between the base of the first transistor and a third source of reference potential,
said output connection means comprises
an output terminal,
means for connecting said output terminal to the emitter of the second transistor, and
a resistor connected between said output terminal and the third source of reference potential,
said high frequency compensation means comprises a series resistance-inductance network,
said second source of reference potentitl is connected to the emitter of the second transistor through a high frequency blocking inductor, and
further including a capacitor connected between the first source of reference potential and the third source of reference potential.

6. A limiter circuit according to claim 3 in which
said output connection means comprises
an output terminal, and
a first filter network connected between the emitter of the second transistor and the output terminal, and
further including a second filter network connected between the collector of the first transistor and the base of the second transistor.

7. A limiter circuit according to claim 6 in which
the anode of the first diode and the cathode of the second diode are connected directly to the emitter of the first transistor and to the collector of the second transistor, and
the alternating current coupling means comprises a capacitor having one terminal connected directly to the cathode of the first diode and the anode of the second diode and having the other terminal connected directly to the base of the second transistor.

8. A limiter circuit according to claim 7 in which
said input connection means comprises
an input terminal,
means for connecting said input terminal to the base of the first transistor, and
a resistor connected between the base of the first transistor and a third source of reference potential,
said first filter network comprises
a first parallel resistance-inductance network connected between the second source of reference potential and the emitter of the second transistor, a capacitor connected between the output terminal and the emitter of the second transistor, and a second parallel resistance-inductance network connected between the output terminal and the third source of reference potential, said second filter network comprises a parallel resistance-capacitance network, said high frequency compensation means comprises a series resistance-inductance network, and further including a parallel resistance-capacitance network connected between the emitter of the first transistor and the first source of reference potential, a capacitor connected between the first source of reference potential and the third source of reference potential, and a capacitor connected between the second source of reference potential and the third source of reference potential.

References Cited

UNITED STATES PATENTS

| | | | |
|---|---|---|---|
| 2,836,713 | 5/1958 | Scott | 307—313 |
| 3,193,774 | 7/1965 | Clapper | 307—313 |
| 3,288,930 | 11/1966 | Johnson | 307—237 |
| 3,329,910 | 7/1967 | Moses | 307—293 |

ARTHUR GAUSS, Primary Examiner

H. A. DIXON, Assistant Examiner